United States Patent
Grider

(10) Patent No.: US 6,933,248 B2
(45) Date of Patent: *Aug. 23, 2005

(54) METHOD FOR TRANSISTOR GATE DIELECTRIC LAYER WITH UNIFORM NITROGEN CONCENTRATION

(75) Inventor: Douglas T. Grider, McKinney, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 09/967,044

(22) Filed: Sep. 28, 2001

(65) Prior Publication Data

US 2002/0072177 A1 Jun. 13, 2002

Related U.S. Application Data

(60) Provisional application No. 60/241,673, filed on Oct. 19, 2000.

(51) Int. Cl.[7] .................................................. H01L 21/31
(52) U.S. Cl. ...................... 438/786; 438/216; 438/287; 438/792; 438/787; 438/774; 438/762; 438/765; 438/769; 438/770; 438/775; 438/776; 438/777

(58) Field of Search ................................. 438/201, 257, 438/216, 792, 787, 774, 762, 765, 769, 770, 775, 776, 777, 786, 287

(56) References Cited

U.S. PATENT DOCUMENTS

| 5,698,464 | A | * | 12/1997 | Tsunoda ......................... 438/4 |
| 5,861,651 | A | * | 1/1999 | Brasen et al. ................. 257/411 |
| 5,972,804 | A | * | 10/1999 | Tobin et al. .................. 438/786 |
| 6,136,654 | A | * | 10/2000 | Kraft et al. ................... 438/287 |
| 6,251,801 | B1 | * | 6/2001 | Saki et al. .................... 438/769 |
| 6,503,846 | B1 | * | 1/2003 | Niimi et al. .................. 438/776 |

* cited by examiner

Primary Examiner—George Fourson
Assistant Examiner—Julio J. Maldonado
(74) Attorney, Agent, or Firm—Peter K. McLarty; W. James Brady, III; Frederick J. Telecky, Jr.

(57) ABSTRACT

The instant invention describes a method for forming a dielectric film with a uniform concentration of nitrogen. The films are formed by first incorporating nitrogen into a dielectric film using RPNO. The films are then annealed in $N_2O$ which redistributes the incorporated species to produce a uniform nitrogen concentration.

12 Claims, 2 Drawing Sheets

METHOD FOR TRANSISTOR GATE DIELECTRIC LAYER WITH UNIFORM NITROGEN CONCENTRATION

CROSS-REFERENCE TO RELATED PATENT/PATENT APPLICATIONS

This application claims priority under 35 USC § 119(e)(1) of provisional application Ser. No. 60/241,673 filed Oct. 19, 2000.

The following co-assigned pending patent applications are hereby incorporated by reference:

| Patent No./Serial No. | Filling Date | TI Case Number | Inventors |
| --- | --- | --- | --- |
| 09/291,844 | Apr. 14, 1999 | TI-23502.1 | Hattangady |

FIELD OF THE INVENTION

The invention is generally related to the field of semiconductor devices and more specifically to method for forming a transistor gate dielectric layer with uniform nitrogen concentration.

BACKGROUND OF THE INVENTION

Remote Plasma Nitrided Oxides (RPNO) (or RPN oxynitrides) have recently shown great promise as a gate dielectric layer in deep submicron CMOS. Its advantages include lower gate leakage by virtue of a thicker dielectric film to achieve the same electrical oxide thickness, a lack of mobility degradation commonly associated with other oxynitrides, excellent boron penetration resistance, and improved PMOS drive current. RPNO films have been demonstrated to have reliability superior to that of a pure silicon oxide film when the overall film thickness is less than about 23 angstroms. Thicker RPNO films have reliability only comparable to that of silicon oxide. This is believed to be due to the non-uniform nitrogen profile obtained in RPNO films. A method to form RPNO films is described in TI-23502.1, application Ser. No. 09/291,844, "Semiconductor device having interfacial nitrogen layers and method of formation", and is hereby incorporated by reference. The curve shown in FIG. 1 represents a typical nitrogen profile that would be obtained from a RPNO film using a measurement technique such as SIMS or Auger analysis. Region 100 represents the RPNO film and region 110 the silicon substrate on which the RPNO film is formed. The nitrogen concentration 115 is seen to peak at the surface of the RPNO film 100 and decrease towards the silicon substrate 110. Current MOSFET technology requires that the reliability of the gate dielectric layer exceed that of pure silicon oxide. There is therefore a need for a transistor gate dielectric layer with reliability exceeding that of pure silicon oxide.

SUMMARY OF THE INVENTION

Accordingly, a need has arisen for a semiconductor device which a gate dielectric layer with a uniform concentration of nitrogen. In accordance with the present invention, a transistor is described that includes a uniform nitrogen concentration in the gate dielectric layer and uses processing techniques that substantially eliminate or reduce disadvantages associated with prior devices and methods of formation.

According to one embodiment of the present invention, a silicon dioxide film is exposed to a nitrogen containing plasma incorporating nitrogen into the film. A thermal anneal is performed in a $N_2O$ ambient to redistribute the incorporated nitrogen and produce a uniform distribution of nitrogen in the film.

One advantage of the above described method is the forming of an asymmetric transistor without a degradation in transistor performance. This and other technical advantages of the instant invention will be readily apparent to one skilled in the art from the following FIGUREs, description, and claims.

BRIEF DESCRIPTION OF THE DRAWINGS

In the drawings.

Corresponding numerals and symbols in the different figures refer to corresponding parts unless otherwise indicated.

DETAILED DESCRIPTION OF THE INVENTION

The invention will now be described in conjunction with the gate dielectric layer of a MOSFET transistor. It will be apparent to those of ordinary skill in the art that the benefits of the invention can be applied to other semiconductor devices.

Figure 1:
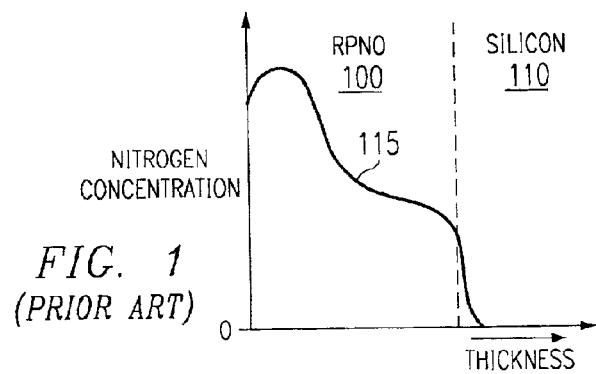
FIG. 1 is a plot showing the nitrogen concentration profile obtained for a RPNO dielectric layer.
Figure 2:
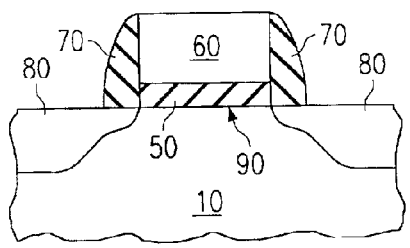
FIG. 2 is a cross-section diagram showing a typical MOS transistor with a gate dielectric formed according to an embodiment of the instant invention.

Shown in FIG. 2 is a MOS transistor with a gate dielectric layer 50 formed according to an embodiment of the instant invention. During normal transistor operation the gate dielectric layer 50 undergoes constant stress from injected hot electrons or holes. Hot electrons or holes are those particles that have acquired enough energy while traversing the channel of the transistor to surmount the gate dielectric layer/silicon substrate energy barrier and enter the gate dielectric layer 50. The carriers that are injected into the gate dielectric layer 50 can create defects in the dielectric layer 50 and at the dielectric layer/silicon substrate interface 90 which can reduce the operating lifetime of the transistor. A measure of how long the transistor operates under certain conditions (i.e. its operating lifetime) is determined by the reliability of the gate dielectric layer 50. The reliability of the gate dielectric layer 50 is therefore an important property of the transistor. In an embodiment of the instant invention it has been found that a gate dielectric layer which comprises silicon oxynitride with a uniform nitrogen concentration which is greater that about 6 atomic percent (6 atm. %) provides improved transistor reliability over existing gate dielectric schemes. This improvement occurs for gate dielectric layers with a layer thickness less than about 40 A. In the instant invention the concept of uniform nitrogen concentration in a layer describes a less than 10% variation in nitrogen concentration across the layer. thickness.

The transistor shown in FIG. 2 is fabricated using standard processing techniques. A gate dielectric layer 50 with a uniform nitrogen concentration greater than 6 atomic percent is formed on a silicon substrate 10 according to an embodiment of the instant invention. A conductive gate layer 60 is formed on the gate dielectric layer 50 and patterned to form a gate structure. Sidewall structures 70 and formed adjacent to the patterned conductive layer 60 and the source and drain regions along with drain and source extensions 80 are formed in the substrate. Additional processing steps could be added to the above described process if different transistor characteristics are desired. A method for the formation of a gate dielectric layer with uniform nitrogen concentration according to an embodiment of the instant invention will be described below.

Figure 3A:
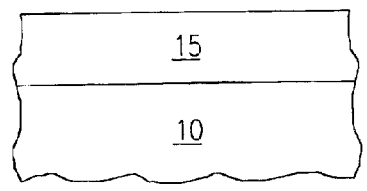
FIGS. 3(a)–3(e) are cross-section diagrams and plots showing an embodiment of the instant invention.

A embodiment of the present invention illustrating the formation of a gate dielectric layer is illustrated in FIGS. 3(a)–3(d). Referring to FIG. 3(a), a semiconductor substrate 10 is provided that comprises suitable materials such as silicon or gallium arsenide. For the case of a silicon substrate, a silicon oxide layer 15 is formed on the surface of the silicon substrate 10. A number of silicon surface preparation techniques such as cleaning and etching could be performed before forming the oxide layer 15. The oxide layer 15 will be on the order of 40 angstroms or less in thickness.

Figures 3B, 3C:
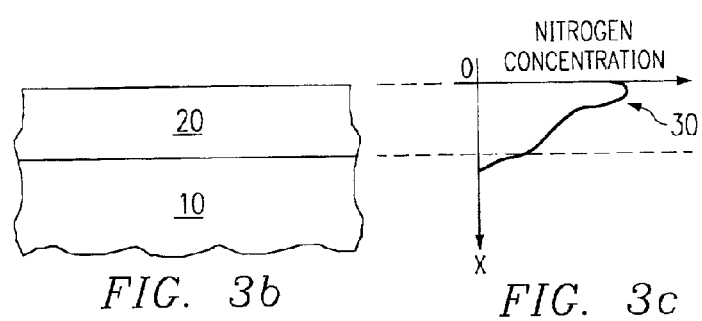
Figures 3D, 3E:
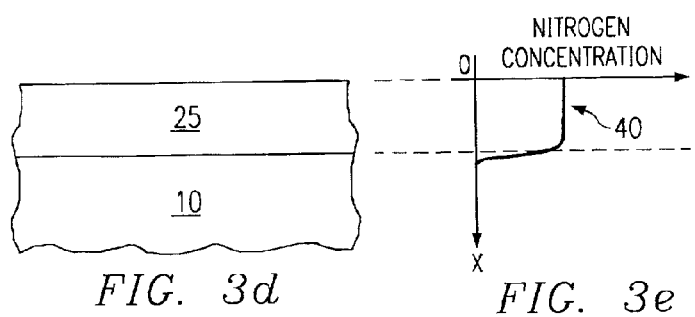

Referring to FIG. 3(b), nitrogen in introduced into the oxide layer 15 by subjecting the substrate 10 and oxide layer 15 to a high-density plasma of molecular nitrogen ($N_2$) or molecular nitrogen ($N_2$) carried along with some inert gas such as helium ($H_2$). The resulting nitrogen containing oxide film (or RPNO film, or RPN oxynitride film, or oxynitride film) 20 has a nitrogen concentration profile which is highest at the surface of the film 20 and decreases towards the substrate 10. The nitrogen profile obtained is shown in FIG. 3(c). The high-density plasma can be generated with a number of different sources including but not limited to helicon, helical-resonator, electron-cyclotron resonance, and inductively coupled. For example, in the case of helicon, high-density, low pressure RF-generated plasma powered by a 13.56 MHz generator, the substrate 10 and oxide layer 15 may be subjected to a 700–900 watt plasma at room temperature without substrate bias for a duration of about 30–80 seconds. The molecular nitrogen flow should be on the order of 4 millitorr. It should be understood that the process parameters described previously are presented solely for the purpose of teaching the advantages of the present invention and that other suitable processes for including nitrogen for forming the film 20 may be used without departing from the intended scope of the present invention. The process described is an extremely low pressure process to provide for the highest ion density and the ion-flux available over the shortest time. Higher pressures may result in ion recombination which consequently reduces ion density. The process also uses a very low plasma potential to reduce ion energies as much as possible. High ion energies can easily damage the extremely thin oxide layer 15. Ion energies are therefore reduced by using no wafer or substrate bias or a wafer bias that is as small as possible. A helicon wave based plasma generator using multipolar magnetic confinement is therefore well suited for the process of the present invention. Solely as an example, one suitable plasma source is the MORI™ 2000 High Density Plasma Source manufactured by P.M.T. Those skilled in the art will recognize that other plasma systems and configurations may also be used without departing from the scope of the present invention.

Referring to FIG. 3(c), the RPN oxynitride layer 20 formed by exposing an oxide film to a high-density $N_2$ plasma is annealed in $N_2O$ at temperatures from 800–1100° C. This anneal is typically a rapid thermal anneal (RTA) for 10–60 seconds. In addition to RTA, furnace anneals in $N_2O$ could also be used. The $N_2O$ anneal will redistribute the nitrogen concentration profile of the RPN oxynitride layer 20 shown in FIG. 3(c) to the uniform nitrogen concentration profile shown in FIG. 3(e). The resulting oxynitride film 25 shown in FIG. 3(d), which is formed by the $N_2O$ anneal of layer 20, has uniform nitrogen concentration and is thus suitable for use as the transistor gate dielectric layer 50 for the MOS transistor shown in FIG. 2. The redistribution of the nitrogen concentration in the RPN oxynitride layer is believed to be due to the scavenging action of $N_2O$. During the annealing process, $N_2O$ breaks up into a number species including NO and O. It is believed that these NO and O species can react with the nitrogen in the RPN oxynitride layer 20 effectively removing nitrogen from the layer 20. It is also believed that the $N_2O$ anneal in addition to removing nitrogen from the surface of the layer 20, will incorporate nitrogen at the interface of the oxynitride layer 20 and the substrate 10. The combined action of both scavenging nitrogen from the surface of the RPN oxynitride layer 20 and including nitrogen at the interface of the oxynitride layer 20 and the substrate 10 during the $N_2O$ annealing process results in the uniform nitrogen concentration shown in FIG. 3(e) for oxynitride layer 25.

Figure 4A:
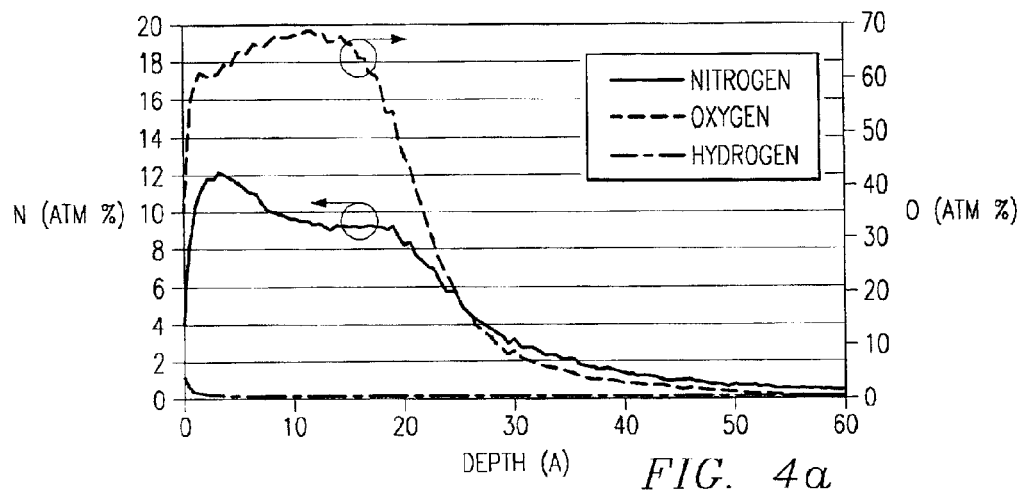
FIGS. 4(a)–4(c) show time of flight (TOF) SIMS profiles obtained from dielectric layers fabricated according to an embodiment of the instant invention.
Figure 4B:
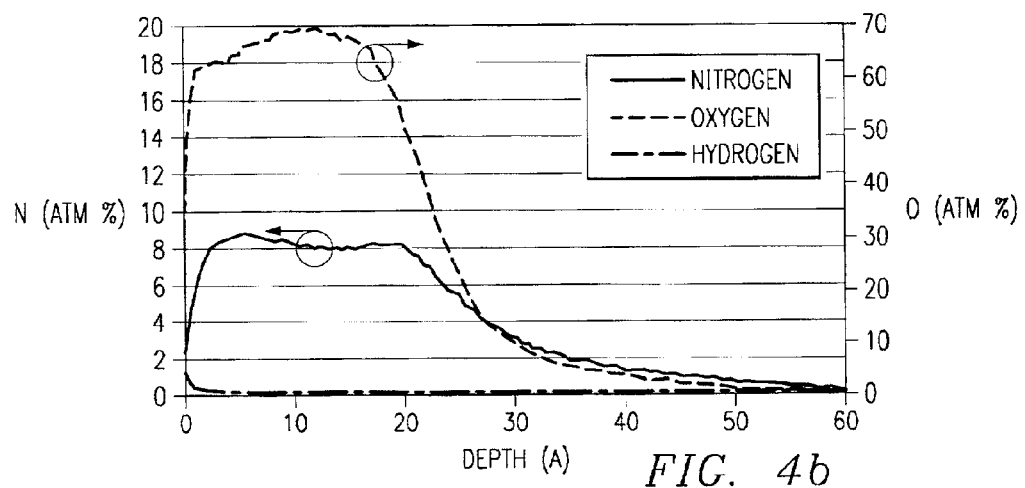
Figure 4C:
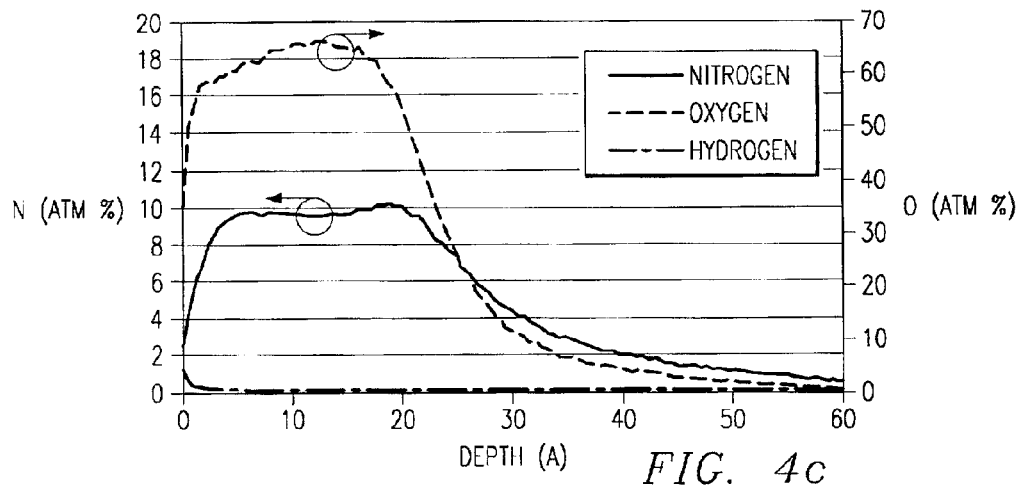

Shown in the table below are the processing conditions used to form oxynitride layers whose nitrogen concentration profiles are shown in FIGS. 4(a)–4(c).

| Oxynitride layer | RPN conditions | $N_2O$ annealing |
|---|---|---|
| 1 | 800 W/45 sec; $N_2$ + $H_2$ | None ($O_2$ anneal at 1000° C. for 60 secs.) |
| 2 | 800 W/45 sec; $N_2$ + $H_2$ | 900° C. for 20 secs. |
| 3 | 800 W/60 sec; $N_2$ + $H_2$ | 900° C. for 20 secs. |

The nitrogen concentration, oxygen concentration, and hydrogen concentration depth profiles shown in FIGS. 4(a)–4(c) were all obtained using the time of flight (ToF) SIMS concentration profiling technique. Shown in FIG. 4(a) are the concentration depth profiles obtained for RPN oxynitride layer 1. The processing conditions used to form layer 1 are given in the table. An initial silicon oxide layer of about 23 A was first formed. The silicon oxide layer was then exposed to a high-density nitrogen plasma with a power level of 800 W for 45 seconds. This was followed by a oxygen ($O_2$) anneal at 1000° C. for 60 seconds. The nitrogen concentration profile 120 shown in FIG. 4(a) shows a peak at the surface of the layer which decreases towards the substrate. The nitrogen concentration varies from about 12 atomic percent of nitrogen at the surface to a value close to zero at the substrate surface. The large nitrogen tail observed below the substrate surface is an artifact of the measurement technique. Shown in FIG. 4(b) are the concentration profiles obtained from an oxynitride layer formed by exposing a 23 A silicon oxide to a $N_2$ plasma at 800 W for 45 seconds followed by a RTA $N_2O$ anneal at 900° C. for 20 seconds. The scavenging action of the $N_2O$ anneal has reduced the surface concentration of nitrogen from about 12 atomic to about 8 atomic percent resulting in an oxynitride film with a uniform nitrogen concentration of about 8 atomic percent. Shown in FIG. 4(c) are the concentration profiles obtained from an oxynitride layer formed by exposing a 23 A silicon oxide to a $N_2$ plasma at 800 W for 60 seconds followed by a RTA $N_2O$ anneal at 900° C. for 20 seconds. Following the $N_2O$ anneal an oxynitride film with a uniform nitrogen concentration of about 10 atomic percent is obtained. The resulting uniform $N_2$ concentration level in film is therefore determined both by the initial RPN process and the $N_2O$ anneal.

The instant invention teaches a method for forming an oxynitride layer with uniform nitrogen concentration. These oxynitride layers are suitable for use as gate dielectric layers in MOS transistors. In an embodiment of the instant invention, the reliability of the MOS transistor (i.e. its immunity to hot carrier degradation) is improved over that of pure silicon oxide if the uniform nitrogen concentration is above 6 atomic percent for a gate dielectric layer thickness less than 40 angstroms. An additional advantage of the instant invention is that the layers formed have no measurable hydrogen. This lack of measurable hydrogen is shown in FIGS. 4(a)–4(c) for oxynitride layers formed according to an embodiment of the instant invention.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

I claim:

1. A method for forming a MOS transistor gate dielectric layer comprising:

providing a semiconductor substrate;

forming an oxide layer on the semiconductor substrate;

exposing the oxide layer to a high-density nitrogen plasma to incorporate nitrogen into the oxide layer thereby converting the oxide layer to an oxynitride layer; and annealing said oxynitride layer in $N_2O$ to form an oxynitride layer with a nitrogen concentration with less than 10% variation across the oxynitride layer.

2. The method of claim 1 wherein the exposing the oxide layer to a high-density nitrogen plasma comprises a plasma power level of 700–900 watts.

3. The method of claim 1 wherein annealing the oxynitride layer in $N_2O$ comprises rapid thermal annealing at a temperature of 800° C.–1100° C. for 10–60 seconds.

4. A method of forming a MOS transistor comprising:

providing a semiconductor substrate;

forming a gate dielectric layer less than 40 angstroms thick on the semiconductor substrate wherein the gate dielectric layer has a nitrogen concentration with less than 10% variation across the gate dielectric layer;

forming a conductive layer on said gate dielectric layer;

forming sidewall structures adjacent to said conductive layer; and forming source and drain regions in the semiconductor substrate adjacent to said sidewall structures.

5. The method of claim 4 wherein said forming the gate dielectric layer comprises:

forming an oxide layer on the semiconductor substrate;

exposing the oxide layer to a high-density nitrogen plasma to incorporate nitrogen into the oxide layer thereby converting the oxide layer to an oxynitride layer; and annealing said oxynitride layer in $N_2O$ to form an oxynitride layer with a uniform nitrogen concentration profile.

6. The method of claim 5 wherein the exposing the oxide layer to a high-density nitrogen plasma comprises a plasma power level of 700–900 watts.

7. The method of claim 5 wherein annealing the oxynitride layer in $N_2O$ comprises rapid thermal annealing at a temperature of 800° C.–1100° C. for 10–60 seconds.

8. The method of claim 4 wherein said uniform nitrogen concentration is greater than 6 atomic percent.

9. A method of forming a MOS transistor comprising:

providing a semiconductor substrate;

forming a gate dielectric layer less than 40 angstroms thick on the semiconductor substrate such that the gate dielectric layer has a nitrogen concentration greater than 6 atomic percent with less than 10% variation across the gate dielectric layer;

forming a conductive layer on said gate dielectric layer;

forming sidewall structures adjacent to said conductive layer; and forming source and drain regions in the semiconductor substrate adjacent to said sidewall structures.

10. The method of claim 9 wherein said forming said gate dielectric layer comprises:

forming an oxide layer on the semiconductor substrate;

exposing the oxide layer to a high-density nitrogen plasma to incorporate nitrogen into the oxide layer thereby converting the oxide layer to an oxynitride layer; and annealing said oxynitride layer in $N_2O$ to form an oxynitride layer with a uniform nitrogen concentration profile.

11. The method of claim 10 wherein the exposing the oxide layer to a high-density nitrogen plasma comprises a plasma power level of 700–900 watts.

12. The method of claim 11 wherein annealing the oxynitride layer in $N_2O$ comprises rapid thermal annealing at a temperature of 800° C.–1100° C. for 10–60 seconds.

* * * * *